United States Patent
Basil et al.

(10) Patent No.: US 11,121,851 B2
(45) Date of Patent: Sep. 14, 2021

(54) DIFFERENTIAL SENSING CIRCUIT FOR CLOCK SKEW CALIBRATION RELATIVE TO REFERENCE CLOCK

(71) Applicant: Texas Instruments Incorporated, Dallas, TX (US)

(72) Inventors: Manu Basil, San Jose, CA (US); Mohan Yang, Cupertino, CA (US); Yongseon Koh, Palo Alto, CA (US); Roland Ribeiro, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/743,706

(22) Filed: Jan. 15, 2020

(65) Prior Publication Data

US 2021/0203473 A1    Jul. 1, 2021

Related U.S. Application Data

(60) Provisional application No. 62/954,425, filed on Dec. 28, 2019.

(51) Int. Cl.
| | |
|---|---|
| *H04L 7/04* | (2006.01) |
| *H03K 19/20* | (2006.01) |
| *H03K 5/01* | (2006.01) |
| *H03L 7/08* | (2006.01) |
| *H03K 5/24* | (2006.01) |

(52) U.S. Cl.
CPC .............. *H04L 7/042* (2013.01); *H03K 5/01* (2013.01); *H03K 5/24* (2013.01); *H03K 19/20* (2013.01); *H03L 7/0807* (2013.01)

(58) Field of Classification Search
CPC . H04L 7/042; H03K 5/01; H03K 5/24; H03K 19/20; H03L 7/0807
See application file for complete search history.

(56) References Cited

U.S. PATENT DOCUMENTS

| | | | |
|---|---|---|---|
| 9,270,256 B2 | 2/2016 | Lee | |
| 10,237,052 B1 * | 3/2019 | Moscone | H04L 7/0025 |
| 10,250,375 B2 * | 4/2019 | Black | H04W 52/02 |
| 10,680,592 B2 * | 6/2020 | Zhao | H03K 5/1565 |
| 10,712,770 B1 * | 7/2020 | Chiang | H04J 3/047 |
| 10,784,845 B2 * | 9/2020 | Doppalapudi | H03K 5/1565 |

(Continued)

OTHER PUBLICATIONS

Zaki, et al. "Design of a Quadrature Clock Conditioning Circuit in 90-nm CMOS Technology," Institute of Electrical and Optical Communication Engineering, University of Stuttgart, Germany, copyright 2008 IEEE (4 pages).

*Primary Examiner* — Freshteh N Aghdam
(74) *Attorney, Agent, or Firm* — John R. Pessetto; Charles A. Brill; Frank D. Cimino

(57) ABSTRACT

A system includes a differential clock source configured to provide a reference clock signal and an inverted version of the reference clock signal. The system also includes a quadrature clock source configured to provide a quadrature clock signal that is phase-shifted relative to the reference clock signal. The system also includes a differential sensing circuit coupled to the differential clock source and the quadrature clock source. The differential sensing circuit is configured to determine skew of the quadrature clock signal based on the reference clock signal, the inverted version of the reference clock signal, and the quadrature clock signal.

18 Claims, 5 Drawing Sheets

(56) References Cited

U.S. PATENT DOCUMENTS

| | | | |
|---|---|---|---|
| 2005/0264338 A1* | 12/2005 | Berkram | G06F 1/10 |
| | | | 327/291 |
| 2014/0093009 A1* | 4/2014 | Song | H04W 56/0035 |
| | | | 375/295 |
| 2015/0303909 A1* | 10/2015 | Arcudia | H03L 7/0807 |
| | | | 341/100 |
| 2017/0063353 A1* | 3/2017 | Coteus | H03K 5/26 |
| 2019/0280682 A1 | 9/2019 | Lee | |
| 2020/0293080 A1* | 9/2020 | Poon | H03K 5/1565 |

* cited by examiner

DIFFERENTIAL SENSING CIRCUIT FOR CLOCK SKEW CALIBRATION RELATIVE TO REFERENCE CLOCK

CROSS-REFERENCE TO RELATED APPLICATION

This application claims priority to U.S. Provisional Application No. 62/954,425, filed Dec. 28, 2019, which is hereby incorporated by reference.

BACKGROUND

In communication links with half-rate clock and data recovery (CDR) circuits, skew between quadrature clocks degrades the input jitter tolerance of the communication link. In serializers and deserializers that use multi-phase clocks, skew between the multi-phase clocks lead to lower setup and hold margins at the multiplexer stages.

One approach to sensing the skew between quadrature clocks is to pass the quadrature clocks through combinational logic such as a NAND gate. The output of the NAND gate will be a waveform whose duty-cycle provides information about the skew between the quadrature clocks. For example, the result of low pass filtering this waveform and comparing the filtered result against a fixed voltage reference indicates whether the quadrature clock is delayed with respect to the main clock or vice versa. This approach has certain drawbacks including a phase to voltage conversion gain limited to the supply voltage (VDD, in volts)_divided by Unit Interval (in seconds). For example, if VDD is 1.1V and Clock frequency is 8 GHz, the phase to voltage conversion gain is given by 1.1 V/125 ps~8.8 mV/ps. This means for every 1 ps of extra skew, the filtered output voltage moves by 8.8 mV with respect to the reference voltage when the VDD is 1.1V. Also, the input referred phase offset of the sensor (e.g., a phase-to-voltage converter such as a NAND gate followed by the comparator) will be divided down by this gain value. A lower gain would mean higher input referred offset value and lower input sensitivity. Also, the accuracy of the sensor depends a lot on the voltage reference used for the comparator. Providing an accurate voltage reference is not a trivial task due to process variations.

SUMMARY

In accordance with at least one example of the disclosure, a system comprises a differential clock source configured to provide a reference clock signal and an inverted version of the reference clock signal. The system also comprises a quadrature clock source configured to provide a quadrature clock signal that is phase-shifted relative to the reference clock signal. The system also comprises a differential sensing circuit coupled to the differential clock source and the quadrature clock source. The differential sensing circuit is configured to determine skew of the quadrature clock signal based on the reference clock signal, the inverted version of the reference clock signal, and the quadrature clock signal.

In accordance with at least one example of the disclosure, a clock skew calibration circuit comprises a differential sensing circuit. The differential sensing circuit comprises a first sense circuit configured to provide a first sense signal based on a reference clock signal and a target clock signal that is phase-shifted relative to the reference clock signal. The differential sensing circuit also comprises a second sense circuit configured to provide a second sense signal based on an inverted version of the reference clock signal and the target clock signal. The differential sensing circuit also comprises a comparator configured to compare the first sense signal and the second sense signal.

In accordance with at least one example of the disclosure, a serializer/deserializer circuit comprises a clock and data recover (CDR) circuit. The serializer/deserializer circuit also comprises a differential sensing circuit coupled to the CDR circuit. The differential sensing circuit comprises a first sense circuit configured to provide a first sense signal based on a reference clock signal and a target clock signal that is phase-shifted relative to the reference clock signal. The differential sensing circuit also comprises a second sense circuit configured to provide a second sense signal based on the target clock signal and an inverted version of the reference clock signal. The differential sensing circuit also comprises a comparator configured to compare the first sense signal and the second sense signal.

BRIEF DESCRIPTION OF THE DRAWINGS

For a detailed description of various examples, reference will now be made to the accompanying drawings in which.

DETAILED DESCRIPTION

Disclosed herein are differential sensing options to accurately determine the skew between different clock systems (e.g., to determine skew between a reference clock signal and a target clock signal). In different examples, a differential sensing circuit is used for skew detection of a quadrature clock signal or other multiphase clock systems as well (e.g., to determine skew between a quadrature clock signal and a quarter-rate clock signal). In some examples, a differential sensing circuit includes a first sense circuit configured to provide a first sense signal based on a reference clock signal and a target clock signal that is phase-shifted relative to the reference clock signal. The differential sensing circuit also includes a second sense circuit configured to provide a second sense signal based on an inverted version of the reference clock signal and the target clock signal. The differential sensing circuit also includes a comparator configured to compare the first sense signal and the second sense signal, where the output of the comparator is used as a skew detection signal that is usable for clock skew correction. The comparator output (skew detection signal) can then be used to correct the skew using a digitally-controlled delay line or phase interpolator. The phase interpolator or delay line phase is digitally incremented or decremented until the comparator output trips in a direction opposite to the initial direction.

With the proposed differential sensing options, higher sensor gain and lower input referred phase offset is possible. To provide a better understanding, various differential sensing options along with related circuits and systems are described using the figures as follows.

Figure 1:
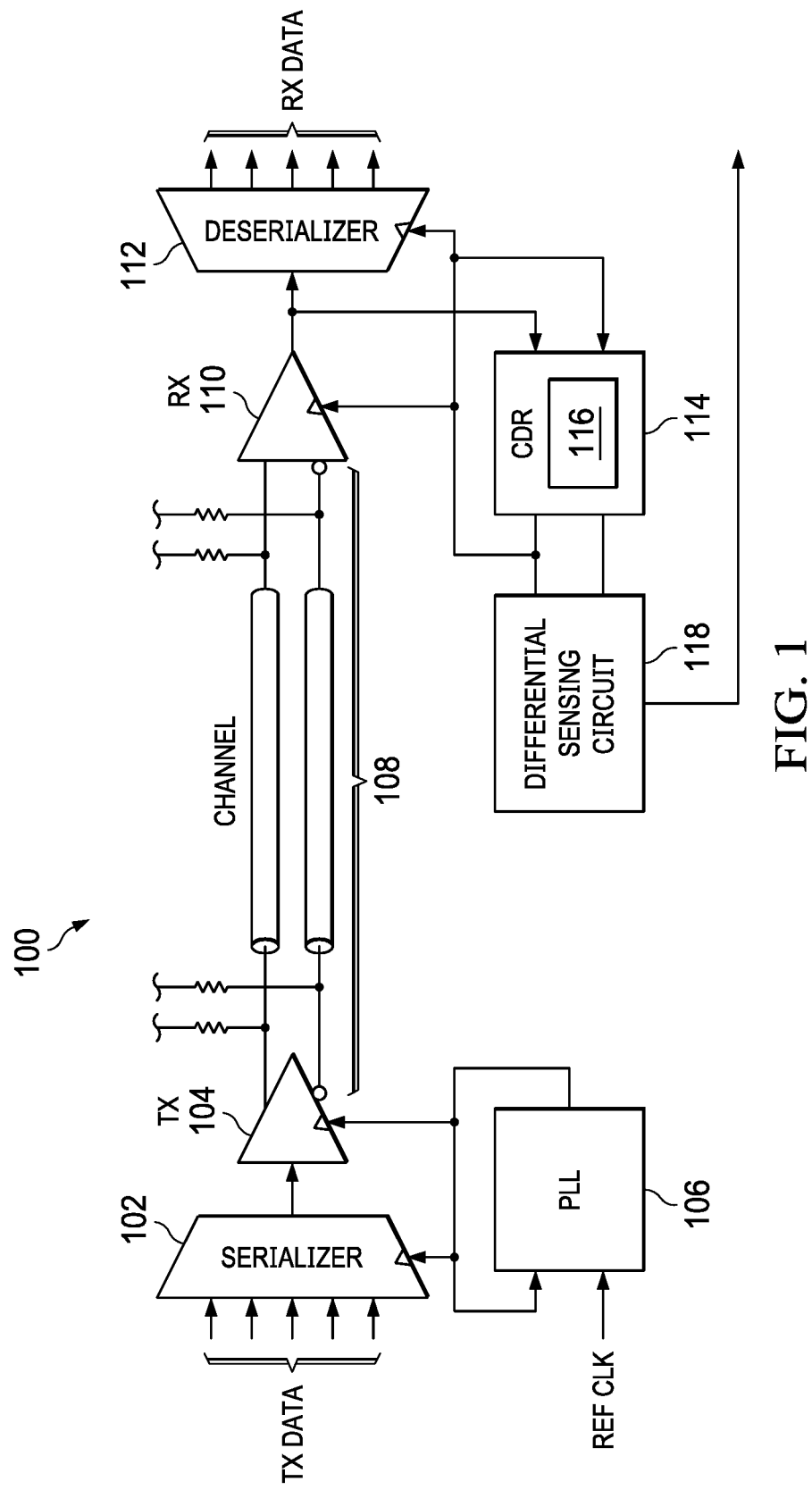
FIG. 1 is a block diagram showing an electrical system in accordance with some examples.

FIG. 1 is a block diagram showing an electrical system 100 in accordance with some examples. As shown, the electrical system 100 includes a serializer 102 configured to serialize transmitter (TX) data, where the TX data is provided to TX 104. In the example of FIG. 1, the TX 104 is clocked by a clock signal generated by a phase-locked loop (PLL) 106, where the input to the PLL 106 is a reference clock signal. The output from the TX 104 is conveyed via a channel 108 to a receiver (RX) 110. The output of the RX 110 is provided to a deserializer 112, resulting in RX data that corresponds to the TX data. In the example of FIG. 1, the RX 110 is clocked by a clock signal provided by a clock and data recovery (CDR) circuit 114. More specifically, the CDR circuit 114 includes a clock generator 116 configured to provide one or more clock signals such as differential clock signals, quadrature clock signals, quarter-rate clock signals, or other clocks signals for use by the RX 110 and the deserializer 112. With the differential sensing circuit 118, an accurate clock skew between a reference clock signal and a target clock signal is determined, where the output from the differential sensing circuit 118 is used for clock skew correction (e.g., to correct clocks output by the clock generator 116 of the CDR circuit 114, or clock generators).

Figure 2:
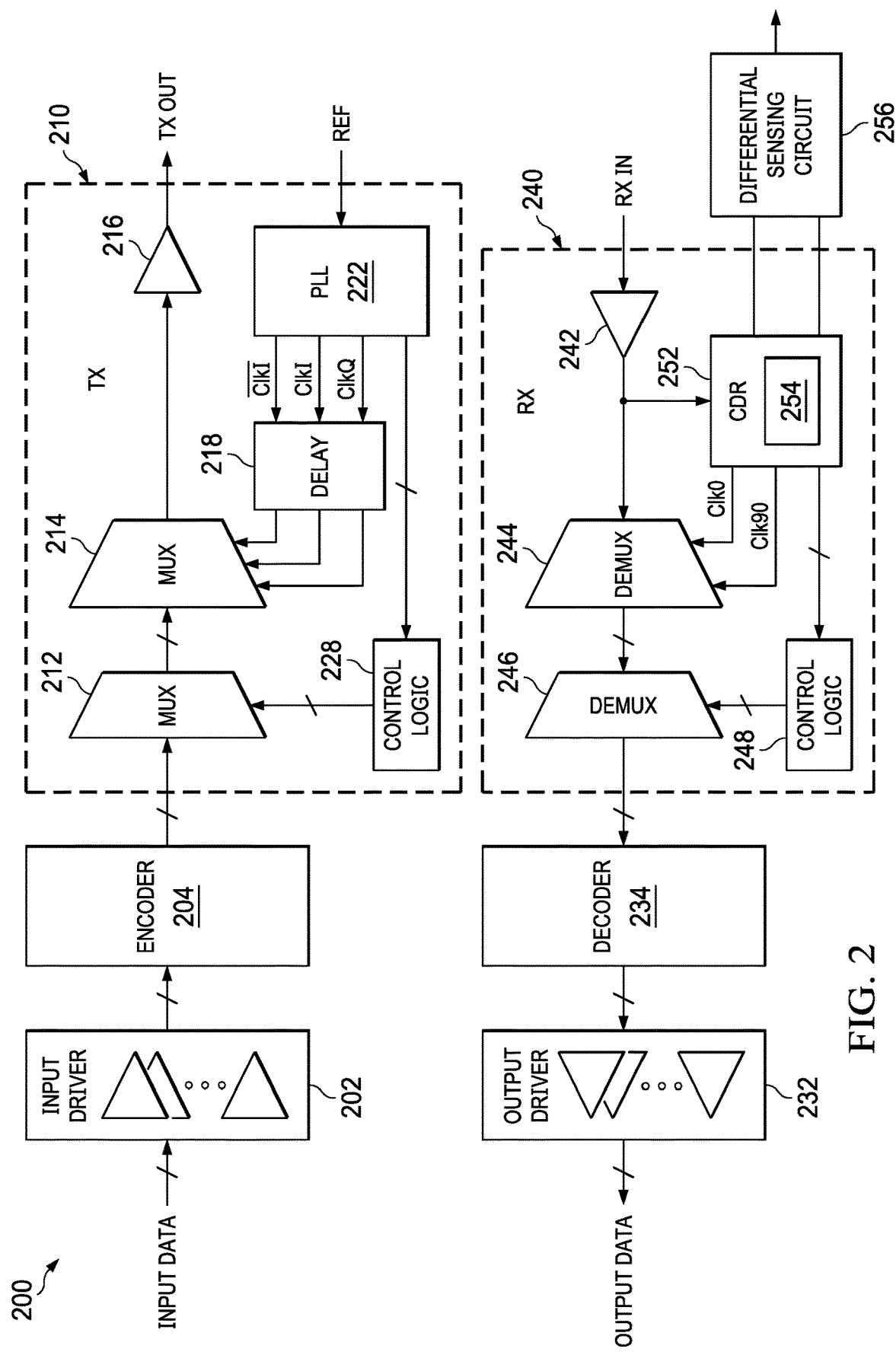
FIG. 2 is a diagram showing of communication system in accordance with some examples.

FIG. 2 is a diagram showing a communication system 200 in accordance with some examples. As shown, the communication system 200 includes an input driver 202 coupled to an encoder 204, where the input driver 202 is configured to receive input data. The output of the encoder 204 is provided to a TX circuit 210 configured to perform serialization operations based on a first multiplexer 212 in series with a second multiplexer 214. As shown, the output of the second multiplexer 214 is buffered by a buffer 216 for output as a TX out signal.

As shown, the first multiplexer 212 is controlled by control logic 220 coupled to a PLL 222 that receives a reference clock (Ref), where the control logic 220 selects a control signal for the first multiplexer 212 based on signals from the PLL 222. In some examples, the second multiplexer 214 receives a clock signal whose frequency is twice that of the first multiplexer 212. In such examples, the signal from the PLL 222 to the control logic 228 is a clock signal with half the frequency as ClkI or ClkQ going to the delay circuit 218, where the output of the delay circuit controls the second multiplexer 214. In the example of FIG. 2, the delay circuit 218 selects a control signal for the second multiplexer 214 based on differential clock signals (CLKI and $\overline{\text{CLKI}}$) and a quadrature clock (ClkQ).

As shown, the communication system 200 also includes an RX circuit 240 having a buffer circuit 242 configured to receive an RX in signal. The output of the buffer circuit 242 is provided to a first demultiplexer 244 in series with a second demultiplexer 246. The output of the buffer circuit 242 is also coupled to a CDR circuit 252. In the example of FIG. 2, the CDR circuit 252 includes a clock generator 254 configured to provide clock signals including a Clk0 signal and a Clk90 signal. As shown, Clk0 and Clk90 are provided as control signals to the first demultiplexer 244, where the output of the first demultiplexer 244 is provided to a second demultiplexer 246. The second demultiplexer 246 is controlled by control logic 248, which controls the second demultiplexer 246 based on control signals from the CDR 252. In some examples, the second demultiplexer 246 receives a clock signal whose frequency is half that of the first demultiplexer 244. In such examples, the signal from the CDR 252 to the control logic 248 is a clock signal with half the frequency as Clk0 or Clk90 going to the first demultiplexer 244. The output of the second demultiplexer 246 is provided to a decoder 234. Also, the output of the decoder 234 is provided to an output deriver 232, resulting in output data.

In the example of FIG. 2, the CDR 252 is coupled to a differential sensing circuit 256 (an example of the differential sensing circuit 118 in FIG. 1), where the differential sensing circuit is configured to accurately detect clock skew between a reference clock signal and a target clock signal. The output of the differential sensing circuit 256 is used to correct the target clock signal for use by the CDR circuit 252 and/or another circuit. In some examples, the corrected target clock signal is used as a new reference clock signal, and the differential sensing circuit 256 is able to detect clock skew between the new reference clock signal and another target clock signal. For example, once a quadrature clock signal is corrected based on differential sensing results, the corrected quadrature clock signal is able to be used as a reference clock signal to determine clock skew between the corrected quadrature clock signal and a target quarter-rate clock signal. In this manner, the skew of multi-phase clock signals is able to be detected and corrected.

Figure 3:
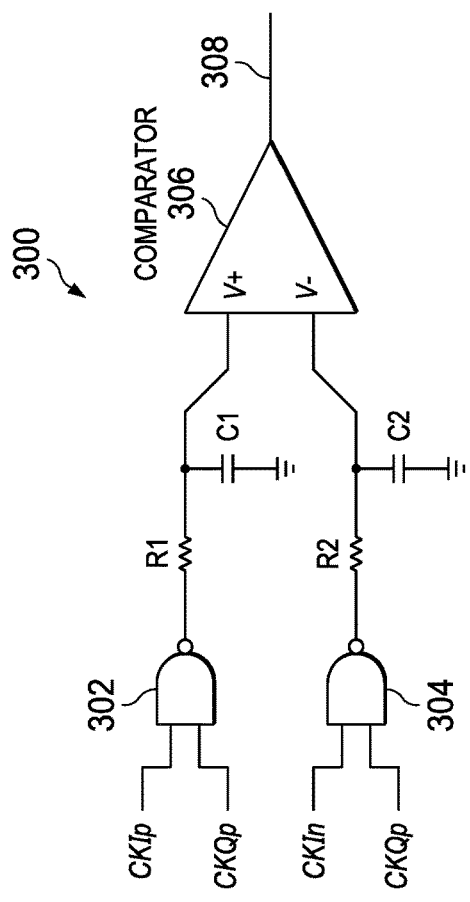
FIG. 3 is a schematic diagram of a differential sensing circuit in accordance with some examples.

FIG. 3 is a schematic diagram of a differential sensing circuit 300 in accordance with some examples. As shown, the differential sensing circuit 300 includes a first sense circuit (e.g., the NAND gate 302, R1, and C1) configured to provide a first sense signal based on a reference clock signal (e.g., CKIp in FIG. 3) and a target clock signal (e.g., CKQp) that is phase-shifted relative to the reference clock signal. The differential sensing circuit 300 also includes a second sense circuit (e.g., the NAND gate 304, R2, and C2) configured to provide a second sense signal based on the target clock signal and an inverted version (e.g., CKIn in FIG. 3) of the reference clock signal. In different examples, the components used for the first and second sensing circuits vary. In some examples, the first and second sensing circuits use XOR/NOR gates rather than a NAND gate. In the example of FIG. 3, NAND gates are used to reduce capacitive loading on the clock signals with the goal being to have R1=R2 and C1=C2 to avoid systematic mismatches. In some examples, the values for R1, R2, C1, C2 are selected so that R1*C1 (or R2*C2) keeps the high frequency ripple on the filtered output voltage below a reasonable value (e.g., less than 5 mVpp). As the value of R1*C1 (or R2*C2) increases, the skew correction time increases. The differential sensing circuit 300 also includes a comparator 306 configured to compare the first sense signal and the second sense signal. The output 308 of the comparator 306 provides an indication of clock skew that is used to correct the target clock signal.

Figure 4:
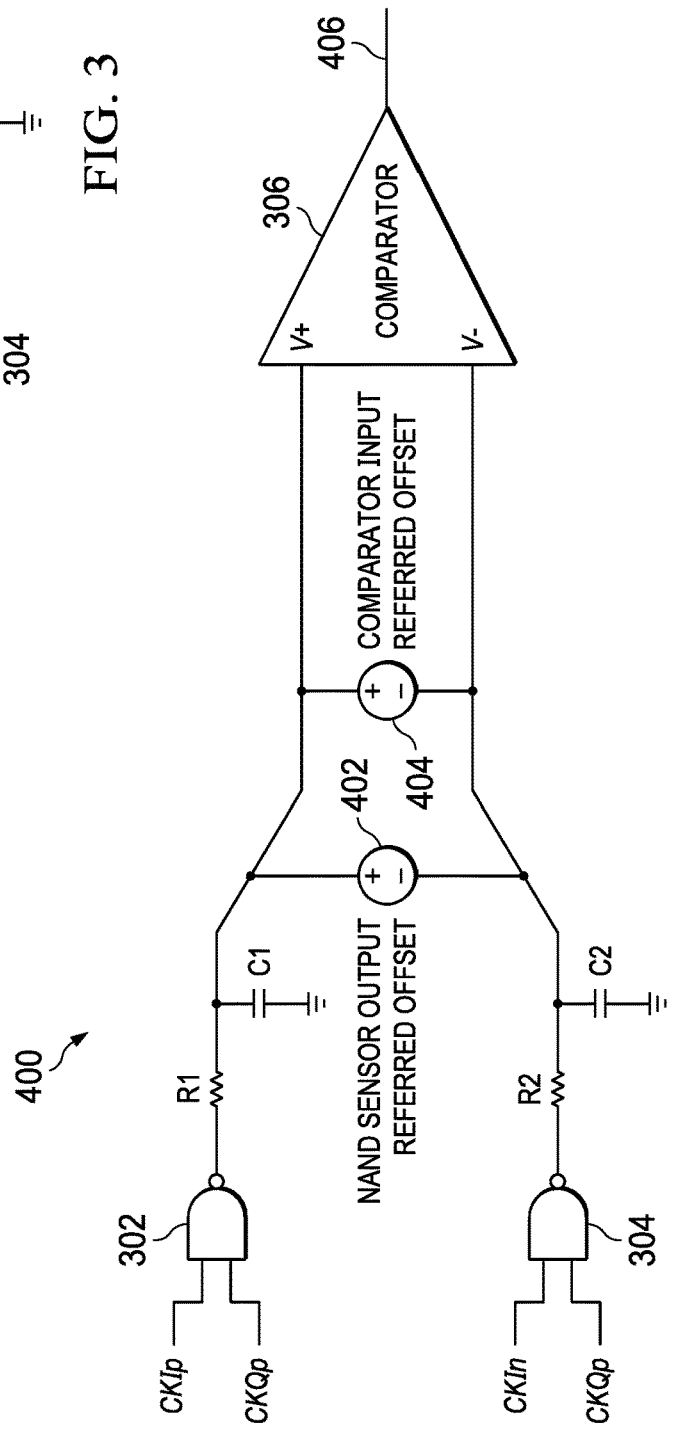
FIG. 4 is a schematic diagram of a differential sensing circuit with comparator offsets in accordance with some examples.

FIG. 4 is a schematic diagram of a differential sensing circuit 400 with comparator offsets 402 and 404 in accordance with some examples. As shown, the differential sensing circuit 400 includes the same components introduced in FIG. 3, and adds comparator offsets 402 and 404 at the inputs of the comparator 306. The comparator offset 402 represents a NAND sensor output referred offset. Also, the comparator offset 404 represents a comparator input referred voltage offset. In the example of FIG. 4, an input referred phase offset of the differential sensing circuit 400 corresponds to the root mean square addition of the comparator offsets 402 and 404 divided by the gain of the NAND gates 302 and 304. With the differential sensing scheme represented in FIG. 4, the input referred phase offset of the sensor is reduced by virtue of increased phase to voltage gain of the NAND gate and filter combination.

With the differential sensing circuit 300 of FIG. 3 and the differential sensing circuit 400 of FIG. 4, instead of comparing NAND{Ip,Qp} against a fixed voltage reference, NAND{Ip,Qp} is compared against NAND{In,Qp}. This doubles the gain of the sensor (2*VDD/Unit Interval) and lowers the input referred phase offset. Also, the mismatch sources at the input of comparator 306 (other than the comparator offset 404) are the two NAND gates 302 and 304, which track each other.

Figure 5:
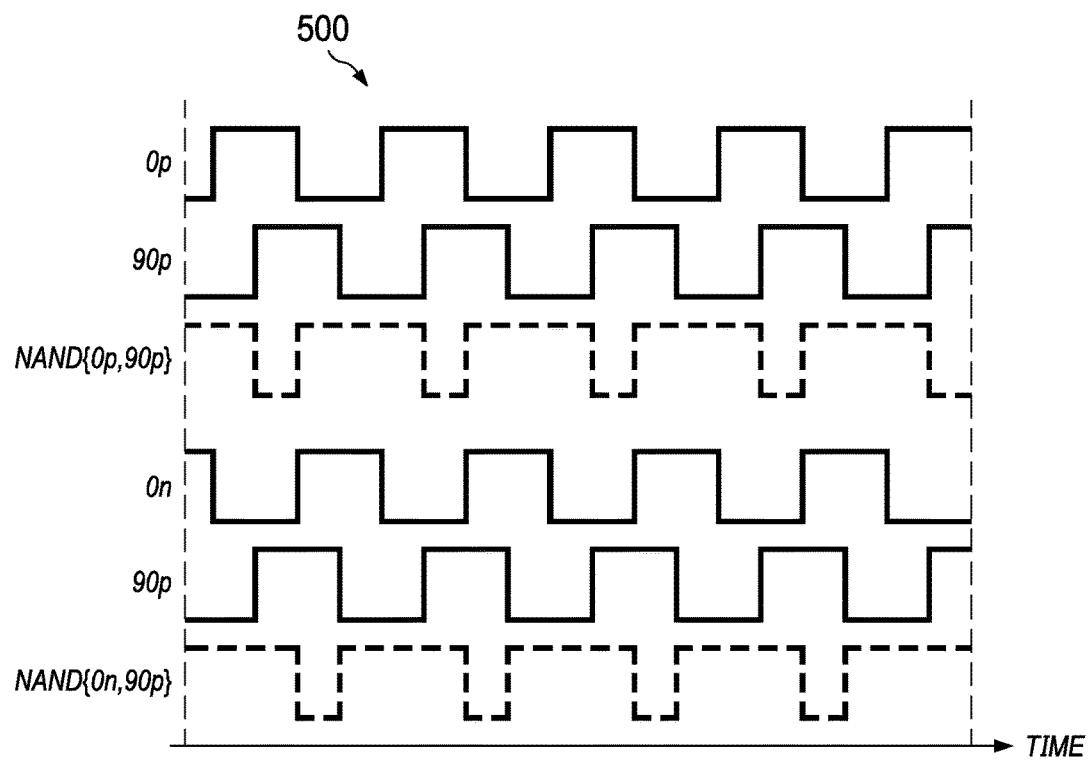
FIG. 5 is a timing diagram showing signals related to the differential sensing circuit of FIG. 3 in accordance with some examples.

FIG. 5 is a timing diagram 500 showing signals (labeled 0p, 90p, NAND{0p, 90p}, 0n, and NAND{0n, 90p}) related to the differential sensing circuit of FIG. 3 in accordance with some examples. In the timing diagram 500, 0p is a reference clock signal, 90p is a quadrature clock signal, NAND{0p, 90p} is the output of the NAND gate 302, 0n is the inverted version of the reference clock signal, and NAND{0n, 90p} is the output of the NAND gate 304. If 90p is delayed relative to a target (e.g., a target skew, a target delay, a target position, or a target quadrature position), the voltage level for the sense signal output from the first sense circuit (e.g., the NAND gate 302, R1, C1) increases and the voltage level for the sense signal output from the second sense circuit (e.g., the NAND gate 302, R2, C2) decreases. If 90p is ahead relative to the target, the voltage level for the sense signal output from the first sense circuit decreases and the voltage level for the sense signal output from the second sense circuit increases.

With the differential sensing circuits 300 and 400, the sense signals are sensitive to duty-cycle distortion of input I and Q clocks. Accordingly, in some examples, a duty-cycle calibration is used to minimize the error due to duty-cycle distortion. Also, the sense signals are sensitive to skew between the Ip and In clocks. Accordingly, in some examples, a skew correction mechanism applied to the Ip and In clocks is used to minimize the error due to Ip and In skew. In some examples, differential duty-cycle distortion correction scheme is used to calibrate the duty-cycle of CKIp and CKIn, where the presence of cross-coupled inverters minimizes the skew between CKIp and CKIn. The improves the accuracy of the differential sensing circuits 300 and 400.

Figure 6:
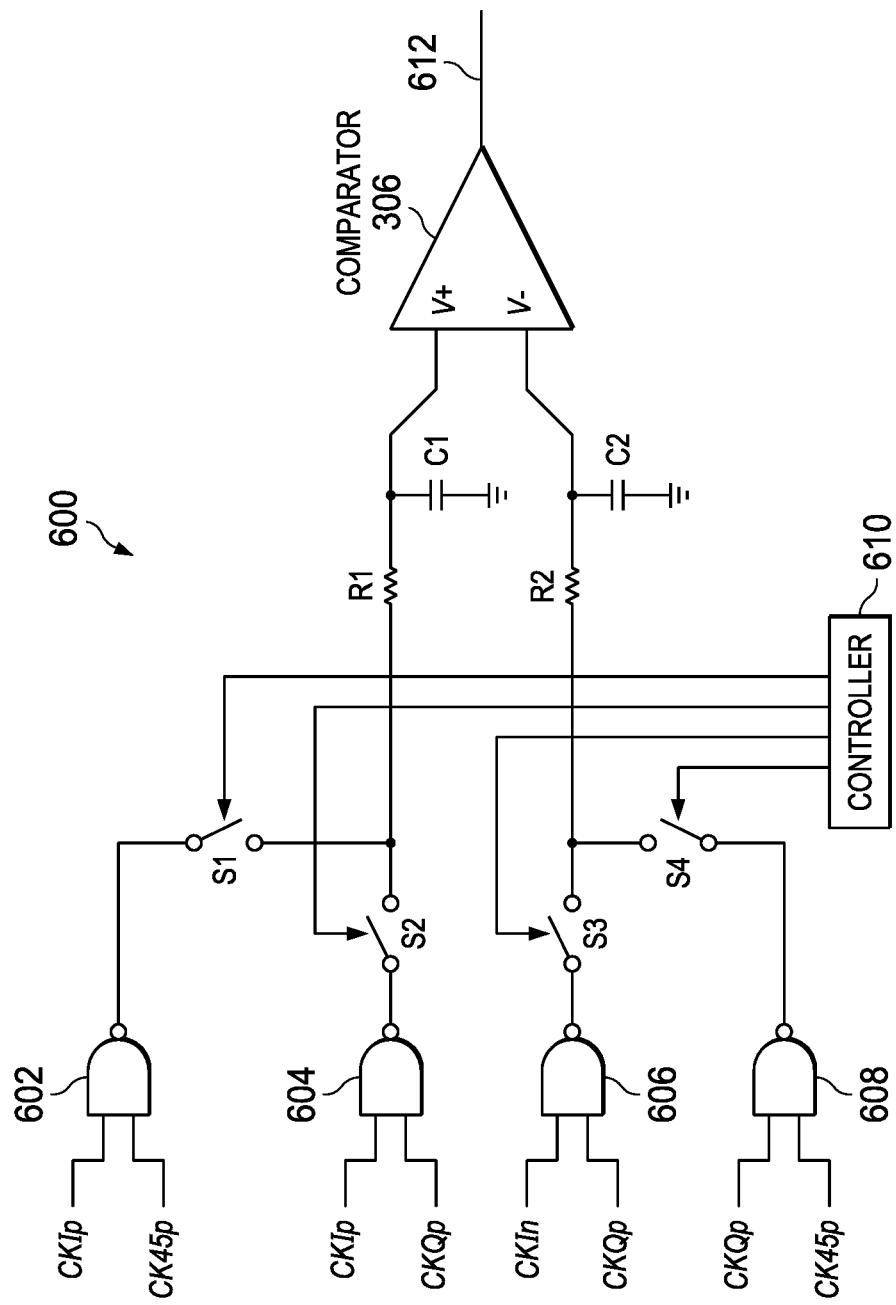
FIG. 6 is a schematic diagram of another differential sensing circuit in accordance with some examples.

FIG. 6 is a schematic diagram of another differential sensing circuit 600 in accordance with some examples. As shown, the differential sensing circuit 600 includes a first sense circuit (e.g., the NAND gate 604, S2, R1, and C1) configured to provide a first sense signal based on a reference clock signal (e.g., CKIp in FIG. 6) and a target clock signal (e.g., CKQp) that is phase-shifted relative to the reference clock signal. The differential sensing circuit 600 also includes a second sense circuit (e.g., the NAND gate 606, S3, R2, and C2) configured to provide a second sense signal based on the target clock signal and an inverted version (e.g., CKIn in FIG. 6) of the reference clock signal. In different examples, the components used for the first and second sensing circuits vary as explained for the differential sensing circuit 300 in FIG. 4. The differential sensing circuit 600 also includes a comparator 306 configured to compare the first sense signal and the second sense signal.

The output 612 of the comparator 306 provides an indication of clock skew that is used to correct the target clock signal (e.g., CKQp and CKQn). In the example of FIG. 6, the differential sensing circuit 600 uses the corrected target clock signal (e.g., CKQp and CKQn) to detect skew of a target quarter-rate clock signal (CK45p). Accordingly, the differential sensing circuit 600 includes a third sense circuit includes a third sense circuit (e.g., the NAND gate 602, S1, R1, and C1) configured to provide a new first sense signal based on a reference clock signal (e.g., CKIp in FIG. 6) and a target clock signal (e.g., CK45p) that is phase-shifted relative to the reference clock signal. The differential sensing circuit 600 also includes a fourth sense circuit (e.g., the NAND gate 608, S4, R2, and C2) configured to provide a new second sense signal based on the target clock signal (e.g., CK45p) and the reference clock signal (e.g., CKQp in FIG. 6). In different examples, the components used for the third and fourth sensing circuits vary as explained for the differential sensing circuit 300 in FIG. 4. Also, while the example of FIG. 6 shows reuse of the RC filters (R1, C1; and R2, C2), it is possible to have separate RC filters for each sensing circuit. Also, S1-S4 need to be controlled to select which input signals are being compared by the comparator 306.

Figure 7:
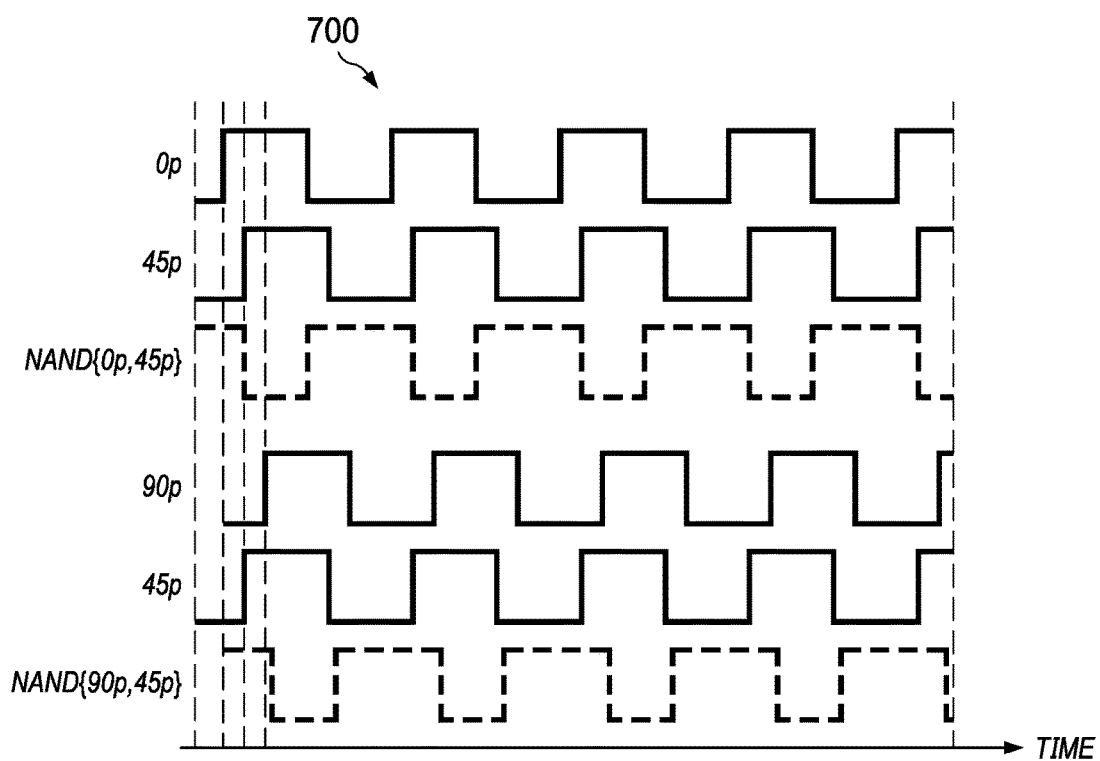
FIG. 7 is a timing diagram showing signals related to the differential sensing circuit of FIG. 6 in accordance with some examples.

FIG. 7 is a timing diagram 700 showing signals (labeled 0p, 45p, NAND{0p, 45p}, 90p, and NAND{90p, 45p}) related to the differential sensing circuit 600 of FIG. 6 in accordance with some examples. In the timing diagram 700, 0p is a reference clock signal, 90p is a quadrature clock signal, NAND{0p, 45p} is the output of the NAND gate 602, 90p is the quadrature clock signal, and NAND{90p, 45p} is the output of the NAND gate 608. If 45p is delayed relative to a target, the voltage level for the sense signal output from the third sense circuit (e.g., the NAND gate 602, R1, C1) increases and the voltage level for the sense signal output from the fourth sense circuit (e.g., the NAND gate 608, R2, C2) decreases. If 45p is ahead relative to the target, the voltage level for the sense signal output from the third sense circuit decreases and the voltage level for the sense signal output from the fourth sense circuit increases.

In some examples, a system (e.g., the electrical system 100 of FIG. 1, or the communication system 200 of FIG. 2) includes a differential clock source (e.g., the clock generator 116 in FIG. 1, or the clock generator 254 in FIG. 2) configured to provide a reference clock signal (e.g., 0p in FIG. 5) and an inverted version (e.g., 0n in FIG. 5) of the reference clock signal. The system also includes a quadrature clock source (e.g., the clock generator 116 in FIG. 1, or the clock generator 254 in FIG. 2) configured to provide a quadrature clock signal (e.g., 90p in FIG. 5) that is phase-shifted relative to the reference clock signal. The system also includes a differential sensing circuit (e.g., the differential sensing circuit 300 in FIG. 3, or the differential sensing circuit 400 in FIG. 4) coupled to the differential clock source and the quadrature clock source, wherein the differential sensing circuit is configured to determine skew of the quadrature clock signal based on the reference clock signal, the inverted version of the reference clock signal, and the quadrature clock signal.

In some examples, the differential sensing circuit includes a first sense circuit (e.g., the NAND gate 302 and a low-pass filter based on R1 and C1 as in FIGS. 3, 4, and 6) configured to provide a first sense signal based on the reference clock signal and the quadrature clock signal. The differential sensing circuit also includes a second sense circuit (e.g., the NAND gate 304 and a low-pass filter based on R2 and C2 as in FIGS. 3, 4, and 6) configured to provide a second sense signal based on the quadrature clock signal and the inverted version of the reference clock signal. The differential sensing circuit also includes a comparator (e.g., the comparator 306 in FIGS. 3, 4, and 6) configured to compare the first sense signal and the second sense signal.

In some examples, an output of the comparator is used to correct the quadrature clock signal. Also in some examples, the corrected quadrature clock signal is used to correct a skew of a quarter-rate clock signal, where the differential sensing circuit is configured to determine skew of the quarter-rate clock signal based on the corrected quadrature clock signal, the reference clock signal, and the quarter-rate clock signal.

In some examples, the differential sensing circuit includes a first NAND gate (e.g., the NAND gate 302 in FIGS. 3 and 4, or the NAND gate 604 in FIG. 6) included with the first sense circuit, wherein the first NAND gate receives the reference clock signal (e.g., CKIp in FIGS. 3, 4, and 6) and the quadrature clock signal (e.g., CKQp in FIGS. 3, 4, and 6) as inputs. The differential sensing circuit also includes a second NAND gate (e.g., the NAND gate 304 in FIGS. 3 and 4, or the NAND gate 606 in FIG. 6) included with the second sense circuit, wherein the second NAND gate receives the quadrature clock signal (e.g., CKQp) and an inverted version (e.g., CKIn) of the reference clock signal as inputs. The differential sensing circuit also includes a third NAND gate (e.g., the NAND gate 608 in FIG. 6) configured to receive the corrected quadrature clock signal (e.g., CKQp into NAND gate 608 is a corrected CKQp) and the quarter-rate clock signal (e.g., CK45$p$ in FIG. 6). The differential sensing circuit also includes a fourth NAND gate (e.g., the NAND gate 602 in FIG. 6) configured to receive the quarter-rate clock signal (e.g., CK45$p$ in FIG. 6) and a reference clock signal (e.g., CKIp in FIG. 6).

In some examples, the differential sensing circuit includes a first switch (e.g., S2) between an output of the first NAND gate and a first low-pass filter included with the first sense circuit. The differential sensing circuit also includes a second switch (e.g., S3) between an output of the second NAND gate and a second low-pass filter included with the second sense circuit. The differential sensing circuit also includes a third switch (S4) between the output of the third NAND gate and the second low-pass filter. The differential sensing circuit also includes a fourth switch (e.g., S1 in FIG. 6) between the output of the fourth NAND gate and the first low-pass filter. The differential sensing circuit also includes a controller (e.g., the controller 610 in FIG. 6) coupled to the first, second, third, and fourth switches. With the controller and switches, the same comparator (e.g., the comparator 306) is re-used in some examples for different stages in the skew correction scheme (e.g., stage 1: quadrature clock skew correction; and stage 2: quarter-rate clock skew correction) to reduce the total number of components.

In some examples, the differential clock source is configured to calibrate a duty-cycle of the reference clock signal and a duty-cycle of the inverted version of the reference clock signal. In some examples, the system includes CDR circuit (e.g., the CDR circuit 114 in FIG. 1, or the CDR circuit 252 in FIG. 2) configured to perform clock recovery operations based on the corrected quadrature clock signal.

In some examples, a differential sensing circuit (any of the differential sensing circuits in FIGS. 3, 4, and 6) is used in a clock skew correction circuit (e.g., for use in the electrical system 100 in FIG. 1, or in the communication system 200 in FIG. 2). In some examples, a differential sensing circuit (any of the differential sensing circuits in FIGS. 3, 4, and 6) is used in a serializer/deserializer circuit with a CDR circuit (e.g., an integrated circuit or packaged chip with the CDR circuit 114 in FIG. 1, the CDR circuit 252 in FIG. 2, and/or other serializer/deserializer components).

With the proposed differential sensing options, skew between the quadrature and multiphase clocks is detected differentially which inherently improves sensitivity. Also, an absolute reference is avoided, which is an improvement over a single-ended sensor topology with a resistor ladder. With the proposed differential sensing options, the reference voltage selection for the negative input to the comparator of the sensor is eliminated, which facilitates skew correction by eliminating careful analyses and simulations used for reference voltage selection, and eliminating trimming based on process corner. Also, it should be noted that the comparator inputs have very different offset sources when comparing the proposed differential sensing options with a single-ended sensor topology with a resistor ladder. Use of the proposed differential sensing options for skew correction obviates the simulation time that is needed to select the reference voltage and the test time (for process trimming after Silicon arrives) needed for a single-ended sensor topology with a resistor ladder. Thus, skew correction based on the proposed differential sensing options save time and money compared to other skew correction options (e.g., with a single-ended sensor topology with a resistor ladder). Also, the proposed differential sensing options are easily extended to different multiphase clock systems.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ."

The term "couple" is used throughout the specification. The term may cover connections, communications, or signal paths that enable a functional relationship consistent with the description of the present disclosure. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

The above discussion is meant to be illustrative of the principles and various embodiments of the present invention. Numerous variations and modifications will become apparent to those skilled in the art once the above disclosure is fully appreciated.

What is claimed is:

1. A system, comprising:
   a differential clock source configured to provide a reference clock signal and an inverted version of the reference clock signal;
   a quadrature clock source configured to provide a quadrature clock signal that is phase-shifted relative to the reference clock signal;
   a differential sensing circuit coupled to the differential clock source and the quadrature clock source, wherein the differential sensing circuit is configured to determine skew of the quadrature clock signal based on the reference clock signal, the inverted version of the reference clock signal, and the quadrature clock signal, wherein the differential sensing circuit comprises:
   a first sense circuit configured to provide a first sense signal based on the reference clock signal and the quadrature clock signal;
   a second sense circuit configured to provide a second sense signal based on the quadrature clock signal and the inverted version of the reference clock signal; and a comparator configured to compare the first sense signal and the second sense signal.

2. The system of claim 1, wherein the first sense circuit comprises a first NAND gate and a first low-pass filter, and wherein the second sense circuit comprises a second NAND gate and a second low-pass filter.

3. The system of claim 1, wherein an output of the comparator is used to correct the quadrature clock signal.

4. The system of claim 3, wherein a corrected quadrature clock signal is used to correct a skew of a quarter-rate clock signal, where the differential sensing circuit is configured to determine skew of the quarter-rate clock signal based on the corrected quadrature clock signal, the reference clock signal, and the quarter-rate clock signal.

5. The system of claim 4, wherein the differential sensing circuit further comprises:
 a first NAND gate included with the first sense circuit, wherein the first NAND gate receives the reference clock signal and the quadrature clock signal as inputs;
 a second NAND gate included with the second sense circuit, wherein the second NAND gate receives the quadrature clock signal and an inverted version of the reference clock signal as inputs;
 a third NAND gate configured to receive the corrected quadrature clock signal and the quarter-rate clock signal;
 a fourth NAND gate configured to receive the quarter-rate clock signal and the reference clock signal.

6. The system of claim 5, wherein the differential sensing circuit further comprises:
 a first switch between an output of the first NAND gate and a first low-pass filter included with the first sense circuit;
 a second switch between an output of the second NAND gate and a second low-pass filter included with the second sense circuit;
 a third switch between the output of the third NAND gate and the second low-pass filter;
 a fourth switch between the output of the fourth NAND gate and the first low-pass filter; and
 a controller coupled to the first, second, third, and fourth switches.

7. The system of claim 3, further comprising a clock and data recovery (CDR) circuit configured to perform clock recovery operations based on a corrected quadrature clock signal.

8. A clock skew calibration circuit, comprising:
 a differential sensing circuit, wherein the differential sensing circuit comprises:
  a first sense circuit configured to provide a first sense signal based on a reference clock signal and a target clock signal that is phase-shifted relative to the reference clock signal;
  a second sense circuit configured to provide a second sense signal based on an inverted version of the reference clock signal and the target clock signal; and
  a comparator configured to compare the first sense signal and the second sense signal.

9. The clock skew calibration circuit of claim 8, wherein the first sense circuit comprises a first NAND gate and a first low-pass filter, and wherein the second sense circuit comprises a second NAND gate and a second low-pass filter.

10. The clock skew calibration circuit of claim 8, wherein the target clock signal is a quadrature clock signal, and wherein an output of the comparator is used to correct skew of the quadrature clock signal.

11. The clock skew calibration circuit of claim 8, wherein the target clock signal is a quarter-rate clock signal, and wherein an output of the comparator is used to correct skew of the quarter-rate clock signal.

12. The clock skew calibration circuit of claim 8, wherein the differential sensing circuit further comprises:
 a first NAND gate included with the first sense circuit, wherein the first NAND gate receives the reference clock signal and the target clock signal as inputs; and
 a second NAND gate included with the second sense circuit, wherein the second NAND gate receives the target clock signal and the inverted version of the reference clock signal as inputs.

13. The clock skew calibration circuit of claim 12, further comprising:
 a third NAND gate configured to receive a corrected target clock signal and a quarter-rate clock signal; and
 a fourth NAND gate configured to receive the quarter-rate clock signal and the reference clock signal.

14. The clock skew calibration circuit of claim 13, wherein the differential sensing circuit further comprises:
 a first switch between an output of the first NAND gate and a first low-pass filter included with the first sense circuit;
 a second switch between an output of the second NAND gate and a second low-pass filter included with the second sense circuit;
 a third switch between the output of the third NAND gate and the second low-pass filter;
 a fourth switch between the output of the fourth NAND gate and the first low-pass filter; and
 a controller coupled to the first, second, third, and fourth switches.

15. A serializer/deserializer circuit, comprising:
 a clock and data recovery (CDR) circuit;
 a differential sensing circuit coupled to the CDR circuit, wherein the differential sensing circuit comprises:
  a first sense circuit configured to provide a first sense signal based on a reference clock signal and a target clock signal that is phase-shifted relative to the reference clock signal;
  a second sense circuit configured to provide a second sense signal based on the target clock signal and an inverted version of the reference clock signal; and
  a comparator configured to compare the first sense signal and the second sense signal.

16. The serializer/deserializer circuit of claim 15,
 wherein the first sense circuit comprises a first NAND gate and a first low-pass filter,
 wherein the second sense circuit comprises a second NAND gate and a second low-pass filter,
 wherein the target clock signal is a quadrature clock signal, and
 wherein an output of the comparator is used to correct skew of the quadrature clock signal.

17. The serializer/deserializer circuit of claim 15, wherein the differential sensing circuit further comprises:
 a first NAND gate included with the first sense circuit, wherein the first NAND gate receives the reference clock signal and the target clock signal as inputs; and
 a second NAND gate included with the second sense circuit, wherein the second NAND gate receives the target clock signal and an inverted version of the reference clock signal as inputs;
 a third NAND gate configured to receive a corrected target clock signal and a quarter-rate clock signal; and a fourth NAND gate configured to receive the quarter-rate clock signal and the reference clock signal, wherein an output of the comparator is used to correct skew of the quarter-rate clock signal.

18. The serializer/deserializer circuit of claim 17, wherein the differential sensing circuit further comprises:

a first switch between an output of the first NAND gate and a first low-pass filter included with the first sense circuit;

a second switch between an output of the second NAND gate and a second low-pass filter included with the second sense circuit;

a third switch between the output of the third NAND gate and the second low-pass filter;

a fourth switch between the output of the fourth NAND gate and the first low-pass filter; and a controller coupled to the first, second, third, and fourth switches.

\* \* \* \* \*